United States Patent
Chae et al.

(10) Patent No.: US 7,257,754 B2
(45) Date of Patent: Aug. 14, 2007

(54) SEMICONDUCTOR MEMORY DEVICE AND TEST PATTERN DATA GENERATING METHOD USING THE SAME

(75) Inventors: Moo-Sung Chae, Gangnam-gu (KR); Hye-In Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 315 days.

(21) Appl. No.: 10/954,870

(22) Filed: Sep. 29, 2004

(65) Prior Publication Data

US 2005/0108607 A1     May 19, 2005

(30) Foreign Application Priority Data

Nov. 14, 2003   (KR)   ...................... 10-2003-0080726

(51) Int. Cl.
G01R 31/28    (2006.01)
G11C 29/00    (2006.01)

(52) U.S. Cl. ...................................... 714/738; 714/720
(58) Field of Classification Search ................ 714/718, 714/721, 724, 738; 365/200–201
See application file for complete search history.

(56) References Cited

U.S. PATENT DOCUMENTS

| | | | | |
|---|---|---|---|---|
| 5,173,906 A | * | 12/1992 | Dreibelbis et al. | 714/733 |
| 5,883,843 A | * | 3/1999 | Hii et al. | 365/201 |
| 6,006,347 A | * | 12/1999 | Churchill et al. | 714/724 |
| 6,374,370 B1 | * | 4/2002 | Bockhaus et al. | 714/39 |
| 6,445,627 B1 | * | 9/2002 | Nakahara et al. | 365/200 |
| 6,636,998 B1 | * | 10/2003 | Lee et al. | 714/735 |
| 6,909,650 B2 | * | 6/2005 | Ryu et al. | 365/201 |

\* cited by examiner

Primary Examiner—Cynthia Britt
(74) Attorney, Agent, or Firm—Marger Johnson & McCollom, P.C.

(57) ABSTRACT

A semiconductor memory device includes a mode setting register for generating a parallel bit test signal and a code according to an externally applied mode setting register code in response to a mode setting command; a data input circuit for receiving and outputting at least one bit of externally applied data in response to a write command; and a test pattern data generating circuit for receiving the parallel bit test signal and a predetermined bit from the code to generate a test pattern data in response to the at least one bit of externally applied data received from the data input circuit.

13 Claims, 5 Drawing Sheets

SEMICONDUCTOR MEMORY DEVICE AND TEST PATTERN DATA GENERATING METHOD USING THE SAME

CROSS-REFERENCE TO RELATED APPLICATION

This application claims priority from Korean Patent Application No. 2003-80726, filed Nov. 14, 2003, the disclosure of which is hereby incorporated herein by reference in its entirety for all purposes.

BACKGROUND OF THE INVENTION

1. Field of the Invention

This disclosure relates to a semiconductor memory device and, more particularly, to a semiconductor memory device that can reduce the number of mode setting register codes used to set a test pattern data during a parallel bit test and a method of generating a test pattern data using the same.

2. Description of the Related Art

A conventional semiconductor memory device has to set and input different mode register setting codes (hereinafter, referred to as simply "MRS codes") with respect to respective test patterns in order to write a test pattern during a parallel bit test. If the conventional semiconductor memory device is able to internally generate a total of 16 unique test patterns (a four-bit test pattern) in response to the MRS codes applied from an external tester during a parallel bit test, the external tester must provide 16 different MRS codes to generate the 16 unique test patterns during a parallel bit test.

Therefore, the conventional semiconductor memory device requires large numbers of MRS codes for a parallel bit test and thus MRS codes that could be put to other uses are in short supply.

Embodiments of the invention address these and other disadvantages of the conventional art.

SUMMARY OF THE INVENTION

Embodiments of the invention provide a semiconductor memory device and a test pattern generating method using the same that can reduce the number of MRS codes used to set a test pattern data during a parallel bit test.

BRIEF DESCRIPTION OF THE DRAWINGS

The above and other features and advantages of the invention will become more apparent to those of ordinary skill in the art by describing in detail preferred embodiments thereof with reference to the attached drawings.

DETAILED DESCRIPTION OF THE INVENTION

Figure 1:
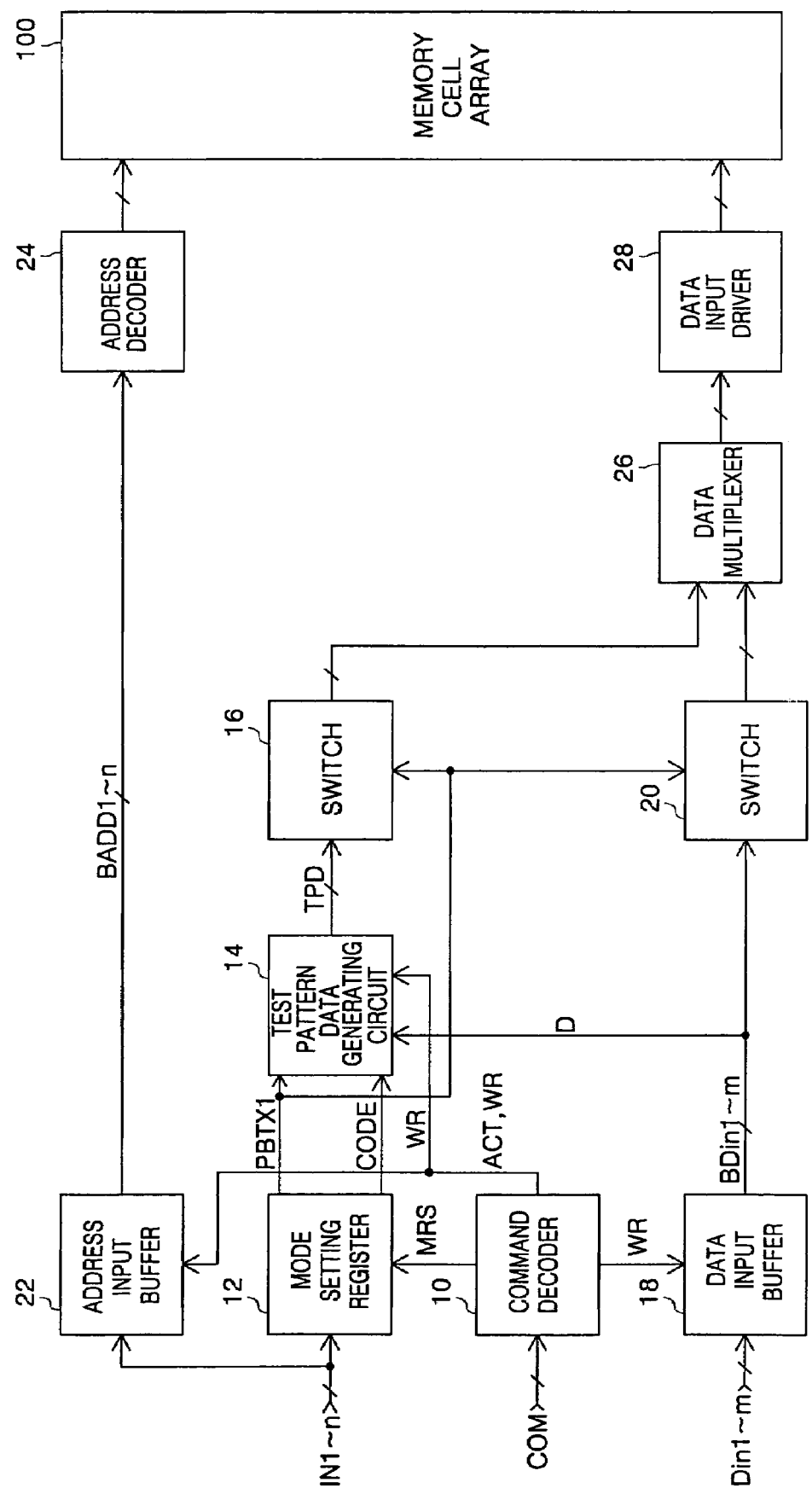
FIG. 1 a block diagram illustrating a semiconductor memory device according to some embodiments of the invention.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 a block diagram illustrating a semiconductor memory device according to some embodiments of the invention. The semiconductor memory device of FIG. 1 includes a command decoder 10, a mode setting register 12, a test pattern data generating circuit 14, switches 16 and 20, a data input buffer 18, an address input buffer 22, an address decoder 24, a data multiplexer 26, a data input driver 28, and a memory cell array 100.

In FIG. 1, "IN1~n" represents MRS codes or addresses applied through an address input terminal, "COM" represents a command applied through a command input terminal, and "Din1~m" represents data applied through a data input terminal.

Functions of components of the semiconductor memory device of FIG. 1 will be explained below.

The command decoder 10 generates a mode setting command MRS, an active command ACT, and a write command WR in response to a command COM that is externally applied. The mode setting register 12 stores MRS codes applied from an external tester (not shown) and outputs a parallel bit test signal PBTX1 and a code CODE in response to a mode setting command MRS. The test pattern data generating circuit 14 generates a test pattern data TPD corresponding to a parallel bit test signal PBTX1 and the code CODE that is output from the mode setting register 12, in response to a write command WR and a buffered data D. Here, data D is a data corresponding to one bit among the buffered data BDin1~m output from the data input buffer 18. The switch 16 transmits the test pattern data TPD in response to a parallel bit test signal PBTX1 during a parallel bit test and cuts off the test pattern data TPD during a normal write operation. The data input buffer 18 buffers data Din1~m input from an external tester to generate buffered data BDin1~m in response to a write command WR. The switch 20 cuts off the buffered data BDin1~m in response to a parallel bit test signal PBTX1 during a parallel bit test and transmits the buffered data BDin1~m during a normal write operation. The data multiplexer 26 outputs data transmitted from the switch 16 during a parallel bit test and outputs data transmitted from the switch 20 during a normal write operation. The data input driver 28 stores data transmitted from the data multiplexer 26 in the memory cell array 100. The address input buffer 22 buffers the row address input IN1~n in response to an active command ACT and generates buffered address BADD1~n buffered by buffering column address input in response to a write command WR. The address decoder 24 decodes the buffered address BADD1~n to select memory cells of the memory cell array 100 corresponding to the decoded address. The memory cell array 100 stores data output from the data input driver 28 in memory cells corresponding to the address decoded by the address decoder 24.

Figure 2:
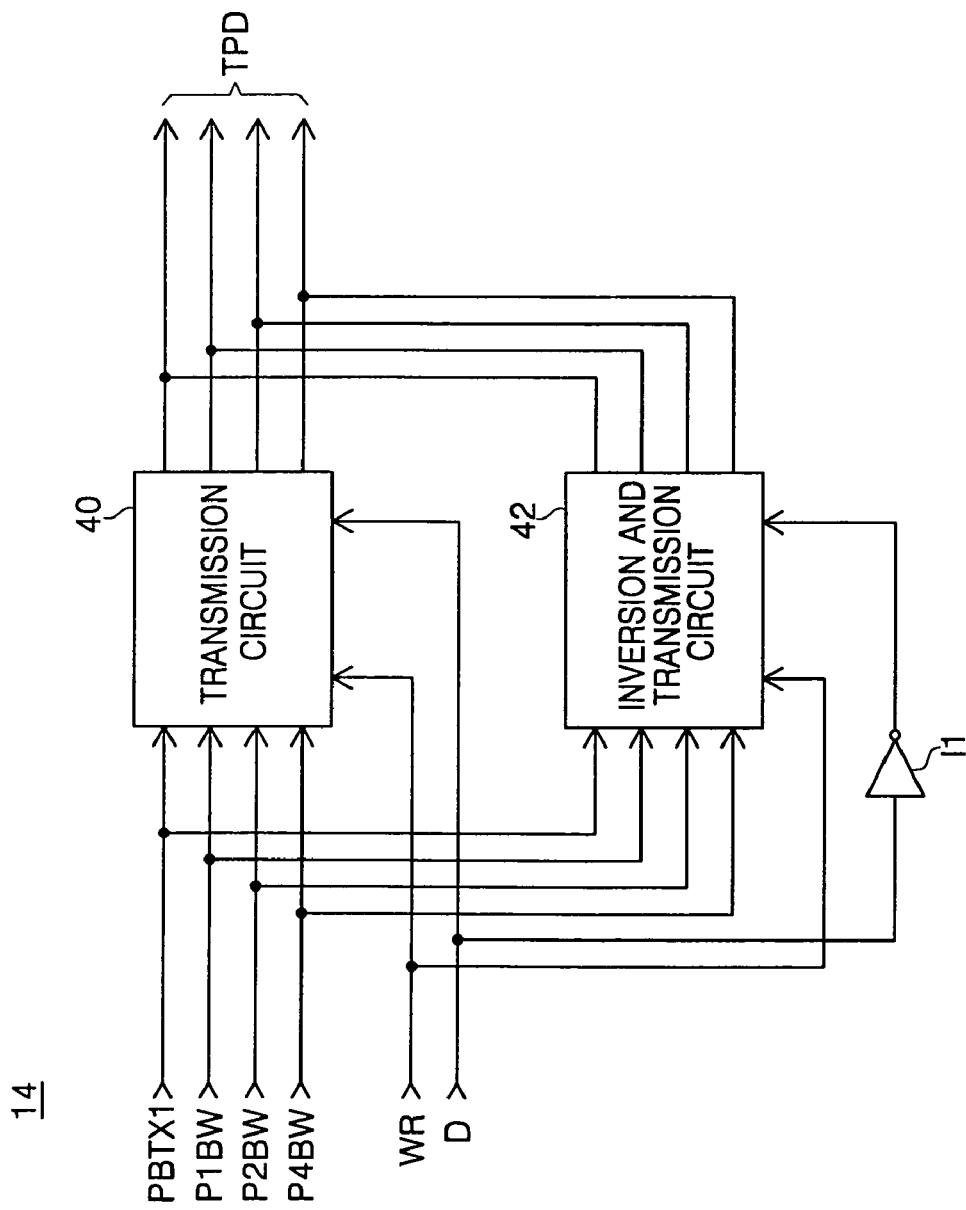
FIG. 2 is a block diagram illustrating a test pattern data generating circuit of the semiconductor memory device of FIG. 1.

FIG. 2 is a block diagram illustrating an example test pattern data generating circuit 14 of the semiconductor memory device of FIG. 1. The test pattern data generating circuit 14 of FIG. 2 includes a transmission circuit 40, an inversion and transmission circuit 42, and an inverter I1.

In FIG. 2, signals P1BW, P2BW, and P4BW represent the code CODE generated by the mode setting register 12 of FIG. 1. Operation of the example test pattern data generating circuit 14 of FIG. 2 will be explained below.

The transmission circuit 40 receives the parallel bit test signal PBTX1 and the signals P1BW, P2BW, and P4BW to generate a test pattern data TPD in response to a write command WR and data D of "1". The inversion and transmission circuit 42 receives a parallel bit test signal PBTX1 and the signals P1BW, P2BW, and P4BW to generate a test pattern data TPD in response to a write command WR and data D of "0".

Table 1, shown below, describes a test pattern data generating method of the test pattern data generating circuit of the semiconductor memory device of FIG. 1.

TABLE 1

|       | 1 | 2 | 3 | 4 | 5 | 6 | 7 | 8 |
|-------|---|---|---|---|---|---|---|---|
| PBTX1 | 1 | 1 | 1 | 1 | 1 | 1 | 1 | 1 |
| P1BW  | 0 | 0 | 0 | 0 | 1 | 1 | 1 | 1 |
| P2BW  | 0 | 0 | 1 | 1 | 0 | 0 | 1 | 1 |
| P4BW  | 0 | 1 | 0 | 1 | 0 | 1 | 0 | 1 |
| D     | 1 | 0 | 1 | 0 | 1 | 0 | 1 | 0 | 1 | 0 | 1 | 0 | 1 | 0 | 1 | 0 |
| TPD   | 1 | 0 | 1 | 0 | 1 | 0 | 1 | 0 | 1 | 0 | 1 | 0 | 1 | 0 | 1 | 0 |
|       | 0 | 1 | 0 | 1 | 0 | 1 | 0 | 1 | 1 | 0 | 1 | 0 | 1 | 0 | 1 | 0 |
|       | 0 | 1 | 0 | 1 | 1 | 0 | 1 | 0 | 0 | 1 | 0 | 1 | 1 | 0 | 1 | 0 |
|       | 0 | 1 | 1 | 0 | 0 | 1 | 1 | 0 | 0 | 1 | 1 | 0 | 0 | 1 | 1 | 0 |

As shown in Table 1, the test pattern data generating circuit 14 can set the state of the signals P1BW, P2BW, and P4BW in 8 different ways ("000", "001", "010", "011", "100", "101", "110", and "111") when the parallel bit test signal PBTX1 is set to "1". Thus, the test pattern data generating circuit 14 generates 8 types of test pattern data TPD ("1000", "1001", "1010", "1011", "1100", "1101", "1110", and "1111") when data D of "1" is input together with a write command WR and 8 types of test pattern data TPD ("0111", "0110", "0101", "0100", "0011", "0010", "0001", and "0000") when data D of "0" is input together with a write command WR.

Therefore, the above embodiments of the invention may generate a total of 16 test pattern data TPD using only 8 MRS codes. As explained above, the conventional semiconductor memory device requires 16 MRS codes to generate a total of 16 test pattern data TPD.

Figure 3:
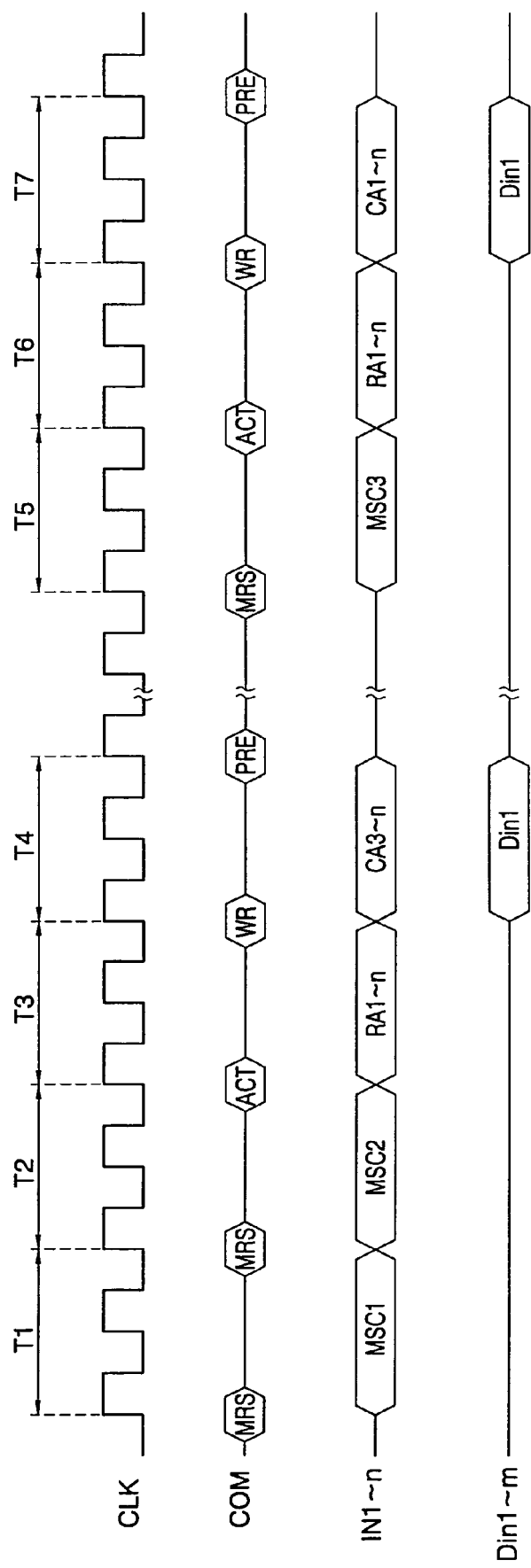
FIG. 3 is a timing diagram illustrating a parallel bit test operation of the semiconductor memory device of FIG. 1.

FIG. 3 is a timing diagram illustrating a parallel bit test operation of the semiconductor memory device of FIG. 1. Let us assume that the semiconductor memory device of FIG. 1 is synchronized with a clock signal CLK to operate and a 4-bit code is generated from the mode setting register 12. A timing margin of a command COM and the externally applied input signals IN1~n is not considered.

During a time period T1, when a command COM to generate a mode setting command MRS and a MRS code MSC1 to set a parallel bit test signal PBTX1 are externally input together, the mode setting register 12 receives the MRS code MSC1 to generate a parallel bit test signal PBTX1 in response to a mode setting command MRS. In response, the switch 16 is turned on, and the switch 20 is turned off.

During a time period T2, when a command COM to generate a mode setting command MRS and a MRS code MSC2 to set a test pattern data TPD are externally input together, the command decoder 10 generates a mode setting command MRS, and the mode setting register 12 stores the MRS code MSC2 externally applied and outputs a code CODE. During a time period T3, when a command COM to generate an active command ACT and row address RA1~n are externally input together, the address input buffer 22 buffers the row address RA1~n to generate the buffered row address BADD1~n. The address decoder 24 selects memory cells of the memory cell array 100 in a row direction corresponding to the buffered row address BADD1~n.

During a time period T4, when a command COM to generate a write command WR, and column address CA3~n and data Din1 are externally input together, the address input buffer 22 buffers the column address CA3~n to generate the buffered column address BADD3~n, and the data input buffer 18 buffers the data Din1 to generate data D. The address decoder 24 selects memory cells of the memory cell array 100 in a column direction corresponding to the buffered column address BADD 3~n. At this time, for the sake of a parallel bit test operation, 4 memory cells in a column direction are simultaneously selected by not applying the lower 2 bits of column address. The test pattern data generating circuit 14 generates a test pattern data TPD corresponding to a parallel bit data signal PBTX1 and a code CODE that are output from the mode setting register 12, as shown in Table 1, in response to a write command WR and data D. The switch 16 outputs the test pattern data TPD to the data multiplexer 22 in response to the parallel bit test signal PBTX1. The data multiplexer 22 outputs the test pattern data TPD input through the switch 16, and the data input driver 28 inputs the test pattern data TPD output from the data multiplexer 22 to the memory cell array 100. As a result, data output from the data input driver 28 are stored in the selected memory cells of the memory cell array 100 in row and column directions. Thereafter, a pre-charge command PRE is applied, and thus the semiconductor memory device performs a pre-charge operation. A parallel bit test operation for one test pattern data is completed by repeatedly performing an operation of applying row address RA1~n together with an active command ACT and applying column address CA3~n together with a write command WR while changing an address.

In order to change a test pattern data, during a time period T5, the same operation as a time period T2 is performed to input a MRS code corresponding to a different test pattern data. During a time period T6, the same operation as a time period T3 is performed, and during a time period T7, the same operation as a time period T4 is performed, thereby performing a parallel bit test operation for a different test pattern data.

That is, the test pattern data generating method of embodiments of the invention performs an operation of applying a mode setting command and a MRS code to change a test pattern data during a parallel bit test. Therefore, a small number of MRS codes are used to generate various test pattern data.

Figure 4:
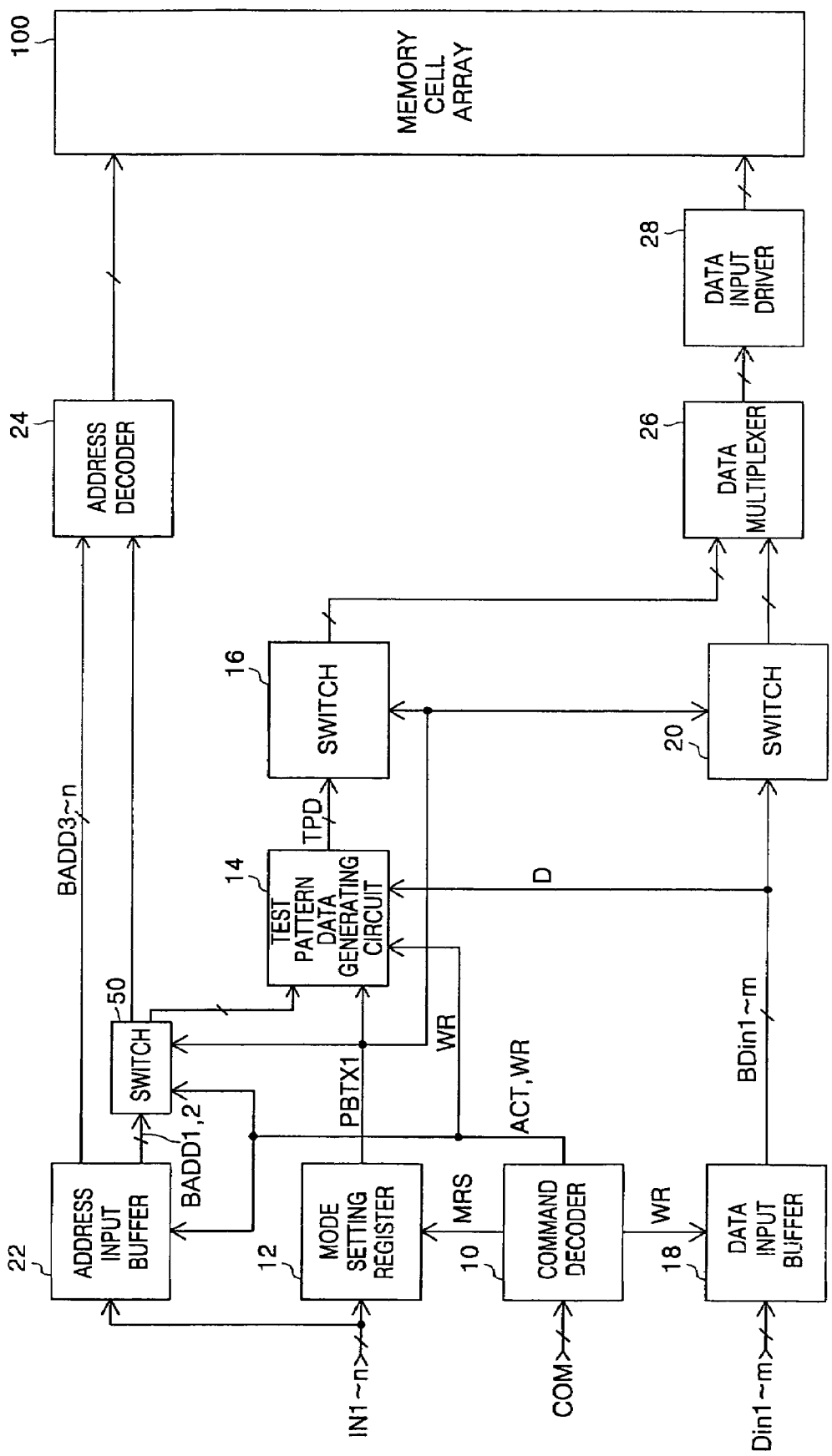
FIG. 4 is a block diagram illustrating a semiconductor memory device according to other embodiments of the invention.

FIG. 4 is a block diagram illustrating a semiconductor memory device according to other embodiments of the invention. The semiconductor memory device of FIG. 4 includes a switch 50 in addition to the components that were illustrated in FIG. 1.

In FIGS. 1 and 4, like reference numerals denote like parts, and thus descriptions of components that were already described in the discussion of FIG. 1 are omitted to avoid repetitiveness. However, the mode setting register 12 and the test pattern data generating circuit 14 of FIG. 4 are slightly different in function than their counterpart mode setting register 12 and test pattern data generating circuit 14 illustrated in FIG. 1. Thus, the functions of the mode setting register 12 and the test pattern data generating circuit 14 of FIG. 4 are explained below.

The mode setting register 12 stores a MRS code for generating a parallel bit test signal PBTX1 in response to a mode setting command MRS. The test pattern data generating circuit 14 generates a test pattern data TPD corresponding to a parallel bit test signal PBTX1 and a code CODE in response to a write command WR and data D. The switch 50 outputs buffered address BADD1, 2 to the address decoder 24 or the test pattern data generating circuit 14 in response to a write command WR and a parallel bit test signal PBTX1.

The semiconductor memory device of FIG. 4 receives MRS codes as predetermined bits of a column address that is not used when a write command is applied during a parallel bit test.

Table 2, shown below, describes a test pattern data generating method of the test pattern data generating circuit 14 of the semiconductor memory device of FIG. 4.

TABLE 2

|       | 1 | 2 | 3 | 4 |
|-------|---|---|---|---|
| PBTX1 | 1 | 1 | 1 | 1 |
| BADD1 | 0 | 0 | 1 | 1 |
| BADD2 | 0 | 1 | 0 | 1 |
| D     | 1 0 | 1 0 | 1 0 | 1 0 |
| TPD   | 0 1 | 0 1 | 0 1 | 0 1 |
|       | 0 1 | 1 0 | 0 1 | 1 0 |
|       | 0 1 | 0 1 | 1 0 | 1 0 |
|       | 0 1 | 1 0 | 1 0 | 0 1 |

As shown in Table 2, the test pattern data generating circuit 14 of the semiconductor memory device of FIG. 4 generates 8 different test pattern data TPD by combining 2 address bits BADD1 and BADD2 output through the switch 50 and data D in the state that a parallel bit test signal PBTX1 is set to "1". That is, when the address BADD1 and BADD2 and data D are "001", "000", "011", "010", "101", "100", "111", and "110" in the state that a parallel bit test signal PBTX1 is set to "1", test pattern data TPD of "0000", "1111", "0101", "1010", "0011", "1100", "0110", and "1001" are generated.

Therefore, the embodiments illustrated by FIG. 4 can generate 8 different test pattern data TPD without requiring MRS codes for setting the test pattern data. This is accomplished by using bits from the column address that are not used during the test.

Figure 5:
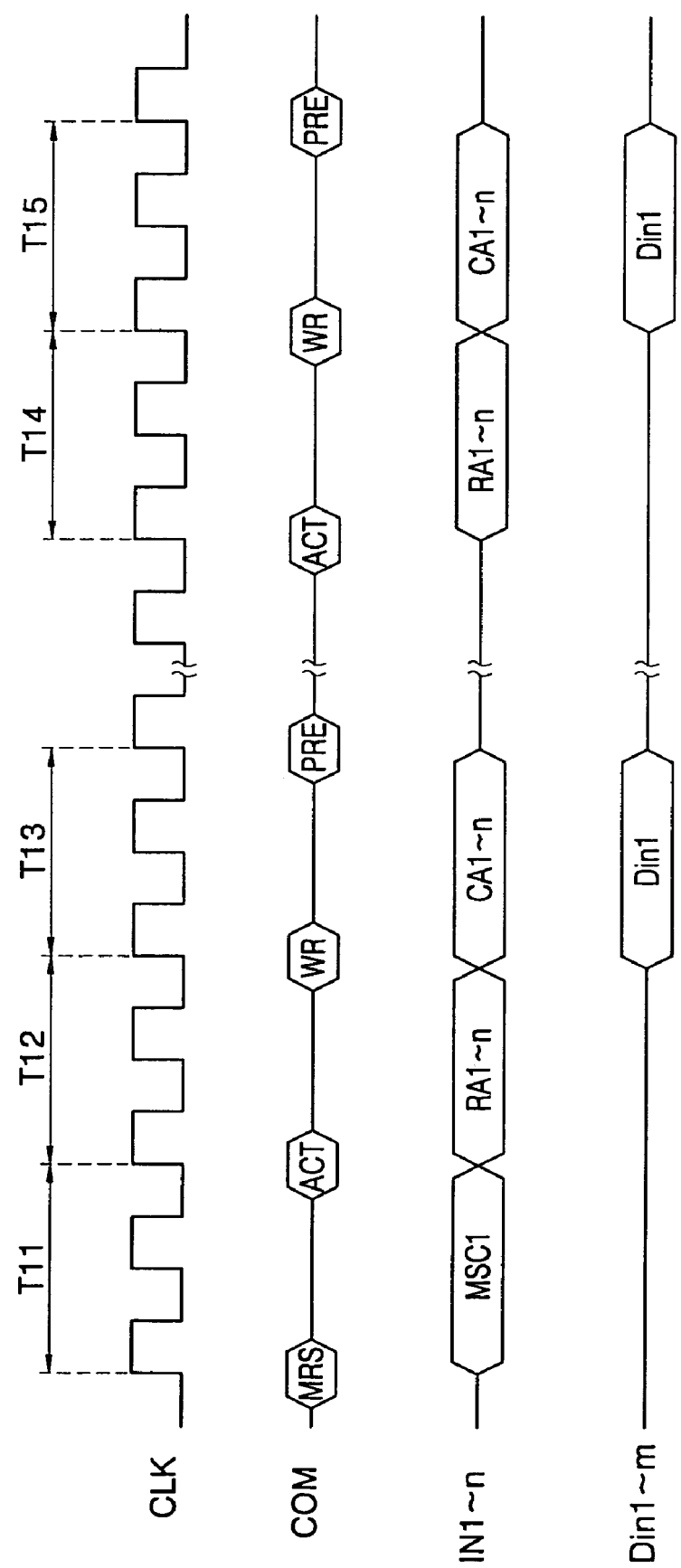
FIG. 5 is a timing diagram illustrating a parallel bit test operation of the semiconductor memory device of FIG. 4.

FIG. 5 is a timing diagram illustrating a parallel bit test operation of the semiconductor memory device of FIG. 4. Like the timing diagram of FIG. 3, the semiconductor memory device is synchronized with a clock signal CLK to operate, and a timing margin of a command COM and input signals IN1~n that are externally applied is not considered.

Operation of a time period T11 is the same as that of a time period T1 of FIG. 3 and therefore a duplicative description is omitted.

Operation of a time period T12 is the same as that of a time period T3 of FIG. 3 and therefore a duplicative description is omitted.

During a time period T13, when column address CA1~n and data Din1 together with a command COM for generating a write command WR are externally applied, the address input buffer 22 buffers the column address CA1~n to generate the buffered column address BADD1~n, and the data input buffer 18 buffers data Din1 to generate data D. At this time, 2 bits of column address CA1,2 of the column address CA1~n are used to generate a test pattern data TPD. The switch 50 outputs the buffered address BADD1,2 to the test pattern data generating circuit 14 in response to a write command WR and a parallel bit test signal PBTX1. The address decoder 24 selects 4 memory cells of the memory cell array 30 in a column direction corresponding to the buffered column address BADD3~n. The test pattern data generating circuit 14 outputs a test pattern data TPD corresponding to the buffered column address BADD1,2 output through the switch 50 and data D in response to a write command WR and a parallel bit test signal PBTX1. That is, the test pattern data TPD corresponding to the column address BADD1,2 and data D are generated as shown in Table 2. The switch 16 outputs the test pattern data TPD to the data multiplexer 22 in response to a parallel bit test signal PBTX1. The data multiplexer 22 outputs the test pattern data TPD input through the switch 16, and the data input driver 28 inputs the test pattern data TPD output from the data multiplexer 22 to the memory cell array 100. As a result, data output from the data input driver 28 are stored in the selected memory cells of the memory cell array 100 in row and column directions.

Thereafter, a pre-charge command PRE is applied, and thus the semiconductor memory device performs a pre-charge operation. A parallel bit test operation for one test pattern data is completed by repeatedly performing an operation of applying row address RA1~n together with an active command ACT and applying column address CA3~n together with a write command WR while changing an address. At this time, the column address CA1,2 which are applied together with a write command WR are fixed.

In order to change a test pattern data, during a time period T14, the same operation as a time period T12 is performed, and during a time period T15, the column address CA1,2 are changed and applied, and the same operation as a time period T13 is performed, thereby performing a parallel bit test operation for a different test pattern data.

That is, the test pattern data generating method of the semiconductor memory device of FIG. 4 changes a test pattern data by simply changing data of bits of the column address that are not used but are applied together with a write command. Thus, it is not necessary to generate another mode setting command MRS or another MRS code.

Therefore, the test pattern data generating circuit of the semiconductor memory device of FIG. 4 does not need to set MRS codes to obtain test pattern data. Also, the operation of inputting MRS codes corresponding to a test pattern data together with a mode setting command is omitted, and thus the required test time becomes shortened.

Even though 2 bits of the column address were not used in the above described embodiments, other embodiments of the invention may be applied when 3 or more bits of column address are not used. Similarly, even though only 1 bit of data D was used in the above described embodiments, other embodiments of the invention may be applied when 2 or more bits of data D are used.

Also, the above embodiments of the invention describe sequentially inputting row and column addresses into the semiconductor memory device in response to an active command and a write command, but other embodiments of the invention may be applied when the row and column addresses are simultaneously input in response to an active command and a write command.

As described above, the semiconductor memory device and the test pattern data generating method according to embodiments of the invention can generate a large number of test pattern data by using a small number of MRS codes from an external portion.

Furthermore, various types of test pattern data can be generated without separately setting MRS codes for generating the test pattern data. Therefore, the MRS codes used for the parallel bit test can be put to other uses.

As explained above, there are many ways to practice the invention. What follows are exemplary, non-limiting descriptions of some embodiments of the invention.

Some embodiments of the invention provide a semiconductor memory device that includes a mode setting register for setting a parallel bit test signal and a code according to a mode setting register code applied externally in response to a mode setting command; a data input circuit for receiving and outputting at least one bit of data applied externally in response to a write command; and a test pattern data generating circuit for receiving the parallel bit test signal and predetermined bits of codes to generate a test pattern data in response to the at least one bit of data output from the data input circuit.

The test pattern data generating circuit includes a transmission circuit for generating the test pattern data by outputting the parallel bit test signal and the predetermined bits of codes "as is" in response to at least of one bit of data; and an inversion and transmission circuit for generating the test pattern data by inverting and outputting the parallel bit test signal and the predetermined bits of codes in response to at least one bit of data.

Other embodiments of the invention further provide a semiconductor memory device that includes a mode setting register for setting a parallel bit test signal according to a mode setting register code applied externally in response to a mode setting command; a data input circuit for receiving and outputting at least one bit of data applied externally in response to a write command; an address input circuit for receiving and outputting address applied externally in response to a write command; and a test pattern data generating circuit for generating a test pattern data by combining predetermined address bits that are input together with the write command and the at least one bit of data in response to the write command and the parallel bit test signal.

The predetermined address bits may be address bits that are not used as an address during a parallel bit test. The address may be a column address.

The semiconductor memory device further includes a switch for outputting the predetermined address bits as the test pattern data in response to the write command and the parallel bit test signal.

Still other embodiments of the invention provide a semiconductor memory device that includes a mode setting register for setting a parallel bit test signal according to a mode setting register code applied externally in response to a mode setting command; a data input circuit for receiving and outputting data applied externally in response to a write command; an address input circuit for receiving and outputting a row address applied externally in response to an active command and for receiving and outputting a column address applied externally in response to the write command; a switch for selecting and outputting predetermined bits of column address output from the address input circuit in response to the write command and the parallel bit test signal; a test pattern data generating circuit for generating a test pattern data by combining predetermined address bits output from the switch and at least one bit of data output from the data input circuit in response to the write command and the parallel bit test signal; a data selecting circuit for selecting and outputting data output from the test pattern data or the data input circuit; and a memory cell array for storing data output from the data selecting circuit in memory cells selected in response to an address output from the address input circuit.

The predetermined address bits may be address bits that are not used as an address during a parallel bit test.

Still other embodiments of the invention provide a test pattern data generating method for a semiconductor memory device that includes generating a parallel bit test signal according to a mode setting register code in response to a mode setting command; setting a state of predetermined bits of codes according to the mode setting register code in response to the mode setting command; receiving at least one bit of data applied externally in response to a write command; and receiving the parallel bit test signal and the predetermined bits of codes to generate a test pattern data in response to the at least one bit of data. The process of generating the test pattern data includes outputting the parallel bit test signal and the predetermined bits of codes "as is" in response to the at least one bit of data; or inverting and outputting the parallel bit test signal and the predetermined bits of codes in response to the at least one bit of data.

Some other embodiments of the invention further provide a test pattern data generating method for a semiconductor memory device that includes generating a parallel bit test signal according to a mode setting register code in response to a mode setting command; receiving at least one bit of data and an address applied externally in response to a write command; and generating a test pattern data by combining predetermined address bits and the at least one bit of data in response to a write command and the parallel bit test signal.

The predetermined address bits may be address bits that are not used as an address during a parallel bit test. The address may be a column address.

As was explained above, various modifications may be made to the described embodiments without departing from the scope and spirit of the invention as defined in the appended claims.

We claim:

1. A semiconductor memory device comprising:
   a mode setting register configured to generate a parallel bit test signal and a code in response to a mode setting register code that is applied externally, and in response to a mode setting command;

a data input circuit configured to receive and output at least one data bit in response to a write command, the at least one data bit applied externally; and a test pattern data generating circuit configured to receive the parallel bit test signal and a predetermined bit of the code, and configured to generate a test pattern data in response to the at least one data bit that is output from the data input circuit.

2. The device of claim 1, the test pattern data generating circuit comprising:

a transmission circuit configured to generate the test pattern data by outputting the parallel bit test signal and the predetermined bit "as is" in response to the at least one data bit; and an inversion circuit configured to generate the test pattern data by inverting and outputting the parallel bit test signal and the predetermined bit in response to the at least one data bit.

3. A semiconductor memory device comprising:

a mode setting register configured to generate a parallel bit test signal and a code in response to a mode setting register code that is applied externally, and in response to a mode setting command;

a data input circuit configured to receive and output at least one data bit in response to a write command, the at least one data bit applied externally;

an address input circuit configured to receive and output an address in response to a write command, the address applied externally; and a test pattern data generating circuit configured to generate a test pattern data by combining a predetermined bit of the address and the at least one data bit in response to the write command and the parallel bit test signal.

4. The device of claim 3, the predetermined bit not configured to be used as a part of the address during a parallel bit test.

5. The device of claim 3, the address comprising a column address.

6. The device of claim 3, further comprising a switch for outputting the predetermined bit to the test pattern data generating circuit in response to the write command and the parallel bit test signal.

7. A semiconductor memory device comprising:

a mode setting register configured to generate a parallel bit test signal according to a mode setting register code that is applied externally, and in response to a mode setting command;

a data input circuit configured to receive and output data in response to a write command, the data applied externally;

an address input circuit configured to receive and output a row address in response to an active command and configured to receive and output a column address in response to the write command, the row address and the column address applied externally;

a switch coupled to the address input circuit and configured to select and output a predetermined bit of the column address in response to the write command and the parallel bit test signal;

a test pattern data generating circuit coupled to the switch and to the data input circuit, the test pattern data generating circuit configured to generate a test pattern data by combining the predetermined bit and at least one data bit of the data in response to the write command and the parallel bit test signal;

a data selecting circuit configured to select the test pattern data from the test pattern data generating circuit or the data from the data input circuit; and a memory cell array configured to store an output from the data selecting circuit in memory cells that are selected in response to an address from the address input circuit.

8. The device of claim 7, the predetermined bit comprising a bit that is not used as an address during a parallel bit test.

9. A test pattern data generating method for a semiconductor memory device comprising:

generating a parallel bit test signal according to a mode setting register code and in response to a mode setting command;

setting a state of a predetermined bit according to the mode setting register code and in response to the mode setting command;

receiving at least one data bit in response to a write command, the at least one data bit applied externally; and receiving the parallel bit test signal and the predetermined bit to generate a test pattern data in response to the at least one data bit.

10. The method of claim 9, wherein generating the test pattern data comprises:

outputting the parallel bit test signal and the predetermined bit if the at least one data bit is in a first state; and outputting an inverted version of the parallel bit test signal and an inverted version of the predetermined bit if the at least one data bit is in a second state.

11. A test pattern data generating method of a semiconductor memory device comprising:

generating a parallel bit test signal according to a mode setting register code and in response to a mode setting command;

receiving at least one data bit and an address in response to a write command, the at least one data bit and the address applied externally; and generating a test pattern data by combining a predetermined bit of the address and the at least one data bit in response to the write command and the parallel bit test signal.

12. The method of claim 11, wherein the predetermined bit is not used as an address during a parallel bit test.

13. The method of claim 11, wherein the address is a column address.

* * * * *